(12) United States Patent
Jia et al.

(10) Patent No.: US 11,817,563 B2
(45) Date of Patent: Nov. 14, 2023

(54) BATTERY MANAGEMENT SYSTEM WAKE-UP METHOD, BATTERY MANAGEMENT SYSTEM WAKE-UP APPARATUS, AND STORAGE MEDIUM

(71) Applicant: CONTEMPORARY AMPEREX TECHNOLOGY CO., LIMITED, Ningde (CN)

(72) Inventors: Hui Jia, Ningde (CN); Xueyu Zhan, Ningde (CN); Jihai Xie, Ningde (CN); Yajie Yuan, Ningde (CN); Jinfu Wang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 56 days.

(21) Appl. No.: 17/864,676

(22) Filed: Jul. 14, 2022

(65) Prior Publication Data

US 2023/0020775 A1 Jan. 19, 2023

Related U.S. Application Data

(63) Continuation of application No. PCT/CN2021/106358, filed on Jul. 14, 2021.

(51) Int. Cl.
*H01M 10/42* (2006.01)
*G01R 31/3835* (2019.01)
(Continued)

(52) U.S. Cl.
CPC .......... *H01M 10/4285* (2013.01); *B60L 58/10* (2019.02); *G01R 31/3835* (2019.01); *H01M 10/425* (2013.01); *H01M 10/486* (2013.01); *H02J 7/0029* (2013.01); *H01M 2010/4271* (2013.01)

(58) Field of Classification Search
None
See application file for complete search history.

(56) References Cited

U.S. PATENT DOCUMENTS

2012/0249055 A1 10/2012 Wade
2021/0234209 A1* 7/2021 Wang et al. .......... G01K 1/026

FOREIGN PATENT DOCUMENTS

CN 111463873 A 7/2020
CN 111942217 A 11/2020
(Continued)

OTHER PUBLICATIONS

English translation of International Search Report of Application No. PCT/CN2021/106358, mailed Apr. 13, 2022.
(Continued)

*Primary Examiner* — Roy Y Yi
(74) *Attorney, Agent, or Firm* — Ladas & Parry LLP

(57) ABSTRACT

Embodiments of this application provide a battery management system (BMS) wake-up method, a BMS wake-up apparatus, and a storage medium, and pertains to the field of battery safety technologies. In this application, before a BMS hibernates, a wake-up threshold corresponding to first sampling information is determined based on an obtained extremum of the first sampling information of a battery cell. After the BMS hibernates, a sampling chip collects second sampling information of the battery cell when the BMS is hibernating, and transmits a wake-up signal to the BMS when it is determined that the second sampling information of the battery cell reaches the wake-up threshold. In this way, the BMS can be woken up in a timely manner by the wake-up signal, and therefore the BMS can find battery safety problems in a timely manner.

16 Claims, 4 Drawing Sheets

(51) Int. Cl.
*H01M 10/48* (2006.01)
*B60L 58/10* (2019.01)
*H02J 7/00* (2006.01)

(56) References Cited

FOREIGN PATENT DOCUMENTS

| CN | 112531824 A | 3/2021 |
| CN | 113036250 A | 6/2021 |
| CN | 113043912 A | 6/2021 |
| CN | 112977160 A | 6/2021 |

OTHER PUBLICATIONS

First Office Action of EP Application No. 21904621.6, mailed Feb. 16, 2023, 11 pages.
International Search Report of Application No. PCT/CN2021/106358, mailed Apr. 13, 2022.
Li et al. "Low Power Strategy Design for Battery Management System," 2009 International Conference on Measuring Technology and Mechatronics Automation, Zhangjiajie, China, pp. 636-639 (Year: 2009).*
Supplementary European Search Report of EP Application No. 21904621.6, mailed Dec. 20, 2022, 4 pages.
Written Opinion of Application No. PCT/CN2021/106358, mailed Apr. 13, 2022.

\* cited by examiner

BATTERY MANAGEMENT SYSTEM WAKE-UP METHOD, BATTERY MANAGEMENT SYSTEM WAKE-UP APPARATUS, AND STORAGE MEDIUM

CROSS REFERENCE TO RELATED APPLICATION

This application is a continuation of International Patent Application No. PCT/CN2021/106358, filed on Jul. 14, 2021, which is incorporated by reference in its entirety.

TECHNICAL FIELD

This application relates to the field of battery safety technologies, and in particular, to a battery management system (BMS) wake-up method, a BMS wake-up apparatus, and a storage medium.

BACKGROUND

Due to high energy density, lithium-ion batteries are widely used in consumer electronic products. With development of vehicles, using the lithium-ion batteries to provide traction energy has become a development trend of the lithium-ion batteries at present. After an internal or external short circuit occurs, a lithium-ion battery releases a large amount of heat within a short time. The temperature rises rapidly to cause thermal runaway, and this shortens a service life of the battery and reduces use safety.

Currently, a battery management system or a vehicle control system can monitor a thermal runaway status of a battery pack only in a wake-up state. When a vehicle is parked and hibernating, the battery management system or the vehicle control system is not working and cannot monitor a thermal runaway status, and thereby cannot find battery safety problems in a timely manner.

SUMMARY

In view of the foregoing problems, embodiments of this application provide a battery management system (BMS) battery management system wake-up method, a BMS wake-up apparatus, and a storage medium, to find battery safety problems in a timely manner.

According to a first aspect of the embodiments of this application, a BMS wake-up method is provided. The method includes:

before a BMS hibernates, obtaining an extremum of first sampling information of a battery cell that is collected by a sampling chip, and determining, based on the extremum, a wake-up threshold corresponding to the first sampling information, where the wake-up threshold is used for the sampling chip to wake up the BMS that is hibernating; and when the BMS is hibernating, receiving a BMS wake-up signal transmitted by the sampling chip and waking up the BMS, where the BMS wake-up signal is transmitted by the sampling chip when it is determined that a sampling value of second sampling information of the battery cell reaches the wake-up threshold, and the second sampling information of the battery cell is collected by the sampling chip when the BMS is hibernating.

In an embodiment of this application, before the BMS hibernates, the wake-up threshold corresponding to the first sampling information is determined based on the obtained extremum of the first sampling information of the battery cell. After the BMS hibernates, the sampling chip collects the second sampling information of the battery cell when the BMS is hibernating, and transmits the wake-up signal to the BMS when it is determined that the second sampling information of the battery cell reaches the wake-up threshold. In this way, the BMS can be woken up in a timely manner by the wake-up signal, and therefore the BMS can find battery safety problems in a timely manner.

Optionally, the first sampling information includes a first sampling voltage, the second sampling information includes a second sampling voltage, the wake-up threshold includes a first abnormal voltage threshold, and the determining, based on the extremum, a wake-up threshold corresponding to the first sampling information includes:

determining a minimum of the first sampling voltage as a first target voltage value; and determining, based on the first target voltage value and a first voltage threshold, the first abnormal voltage threshold.

Optionally, the first voltage threshold includes a voltage down-regulation threshold, and the determining, based on the first target voltage value and a first voltage threshold, the first abnormal voltage threshold includes:

determining a difference between the first target voltage value and the voltage down-regulation threshold as the first abnormal voltage threshold.

Optionally, the first voltage threshold includes a voltage down-regulation threshold and a battery cell undervoltage class 2 threshold, and the determining, based on the first target voltage value and a first voltage threshold, the first abnormal voltage threshold includes:

determining a larger one of the battery cell undervoltage class 2 threshold and a difference between the first target voltage value and the voltage down-regulation threshold as the first abnormal voltage threshold.

In an embodiment of this application, one wake-up threshold (that is, the first abnormal voltage threshold) corresponding to the first sampling voltage is determined based on the minimum (that is, the first target voltage value) of the first sampling voltage and the first voltage threshold. The first voltage threshold is set based on a case that a voltage drops in a battery cell depolarization process, and/or a case that no battery cell undervoltage class 2 occurs in a battery cell depolarization process, and therefore is high in accuracy. Therefore, accuracy of the first abnormal voltage threshold that is determined based on the first target voltage value and the first voltage threshold is also improved.

Optionally, the first sampling information includes a first sampling voltage, the second sampling information includes a second sampling voltage, the wake-up threshold includes a second abnormal voltage threshold, and the determining, based on the extremum, a wake-up threshold corresponding to the first sampling information includes:

determining a maximum of the first sampling voltage as a second target voltage value; and determining, based on the second target voltage value and a second voltage threshold, the second abnormal voltage threshold.

Optionally, the second voltage threshold includes a first voltage up-regulation threshold, and the determining, based on the second target voltage value and a second voltage threshold, the second abnormal voltage threshold includes:

determining a sum of the second target voltage value and the first voltage up-regulation threshold as the second abnormal voltage threshold.

Optionally, the second voltage threshold includes a first voltage up-regulation threshold, a battery cell full charge voltage and a second voltage up-regulation threshold, and the determining, based on the second target voltage value and a second voltage threshold, the second abnormal voltage threshold includes:

determining a smaller one of a sum of the second target voltage value and the first voltage up-regulation threshold, and a sum of the battery cell full charge voltage and the second voltage up-regulation threshold as the second abnormal voltage threshold.

In an embodiment of this application, another wake-up threshold (that is, the second abnormal voltage threshold) corresponding to the first sampling voltage is determined based on the maximum (that is, the second target voltage value) of the first sampling voltage and the second voltage threshold. The second voltage threshold is set based on a case that a voltage rises back in a battery cell depolarization process, and/or a case that a voltage of a battery cell normally does not exceed the full charge voltage plus the second voltage up-regulation threshold, and therefore is high in accuracy. Therefore, accuracy of the second abnormal voltage threshold that is determined based on the second target voltage value and the second voltage threshold is also improved.

Optionally, the first sampling information includes a first sampling temperature, the second sampling information includes a second sampling temperature, the wake-up threshold includes a first abnormal temperature threshold, and the determining, based on the extremum, a wake-up threshold corresponding to the first sampling information includes:

determining a maximum of the first sampling temperature as a first target temperature value; and
determining a sum of the first target temperature value and a temperature up-regulation threshold as the first abnormal temperature threshold.

In an embodiment of this application, after the BMS hibernates, a battery pack is in a standing state, and a temperature may rise back but does not reach a quite high value. In this application, the maximum of the first sampling temperature is up-regulated by adding the temperature up-regulation threshold, to obtain the first abnormal temperature threshold. This is high in accuracy.

According to a second aspect of the embodiments of this application, a BMS wake-up apparatus is provided. The apparatus includes:

a determining module, configured to obtain, before a BMS hibernates, an extremum of first sampling information of a battery cell that is collected by a sampling chip, and determine, based on the extremum, a wake-up threshold corresponding to the first sampling information, where the wake-up threshold is used for the sampling chip to wake up the BMS that is hibernating; and
a wake-up signal receiving module, configured to receive, when the BMS is hibernating, a BMS wake-up signal transmitted by the sampling chip and wake up the BMS, where the BMS wake-up signal is transmitted by the sampling chip when it is determined that a sampling value of second sampling information of the battery cell reaches the wake-up threshold, and the second sampling information of the battery cell is collected by the sampling chip when the BMS is hibernating.

Optionally, the first sampling information includes a first sampling voltage, the second sampling information includes a second sampling voltage, the wake-up threshold includes a first abnormal voltage threshold, and the determining module is configured to:

determine a minimum of the first sampling voltage as a first target voltage value; and
determine, based on the first target voltage value and a first voltage threshold, the first abnormal voltage threshold.

Optionally, the first voltage threshold includes a voltage down-regulation threshold, and the determining module is configured to:

determine a difference between the first target voltage value and the voltage down-regulation threshold as the first abnormal voltage threshold.

Optionally, the first voltage threshold includes a voltage down-regulation threshold and a battery cell undervoltage class 2 threshold, and the determining module is configured to:

determine a larger one of the battery cell undervoltage class 2 threshold and a difference between the first target voltage value and the voltage down-regulation threshold as the first abnormal voltage threshold.

Optionally, the first sampling information includes a first sampling voltage, the second sampling information includes a second sampling voltage, the wake-up threshold includes a second abnormal voltage threshold, and the determining module is configured to:

determine a maximum of the first sampling voltage as a second target voltage value; and
determine, based on the second target voltage value and a second voltage threshold, the second abnormal voltage threshold.

Optionally, the second voltage threshold includes a first voltage up-regulation threshold, and the determining module is configured to:

determine a sum of the second target voltage value and the first voltage up-regulation threshold as the second abnormal voltage threshold.

Optionally, the second voltage threshold includes a first voltage up-regulation threshold, a battery cell full charge voltage and a second voltage up-regulation threshold, and the determining module is configured to:

determine a smaller one of a sum of the second target voltage value and the first voltage up-regulation threshold, and a sum of the battery cell full charge voltage and the second voltage up-regulation threshold as the second abnormal voltage threshold.

Optionally, the first sampling information includes a first sampling temperature, the second sampling information includes a second sampling temperature, the wake-up threshold includes a first abnormal temperature threshold, and the determining module is configured to:

determine a maximum of the first sampling temperature as a first target temperature value; and
determine a sum of the first target temperature value and a temperature up-regulation threshold as the first abnormal temperature threshold.

According to a third aspect of the embodiments of this application, a computer-readable storage medium is provided, where the computer-readable storage medium stores a computer program. When the computer program is executed by a processor, the BMS wake-up method according to the first aspect is implemented.

According to a third aspect of the embodiments of this application, an electronic device is provided, including:

a processor; and
a memory, configured to store executable instructions of the processor;

where the processor is configured to implement, by executing the executable instructions, the BMS wake-up method according to the first aspect.

In an embodiment of this application, before a BMS hibernates, a wake-up threshold corresponding to first sampling information is determined based on an obtained extremum of the first sampling information of a battery cell. After the BMS hibernates, a sampling chip collects second sampling information of the battery cell when the BMS is hibernating, and transmits a wake-up signal to the BMS when it is determined that the second sampling information of the battery cell reaches the wake-up threshold. In this way, the BMS can be woken up in a timely manner by the wake-up signal, and therefore the BMS can find battery safety problems in a timely manner.

BRIEF DESCRIPTION OF DRAWINGS

To describe the technical solutions in the embodiments of this application more clearly, the following briefly describes the accompanying drawings required for describing the embodiments. Apparently, the accompanying drawings in the following description show some embodiments of this application, and a person of ordinary skill in the art may still derive other drawings from these accompanying drawings without creative efforts.

DESCRIPTION OF EMBODIMENTS

Figure 1:
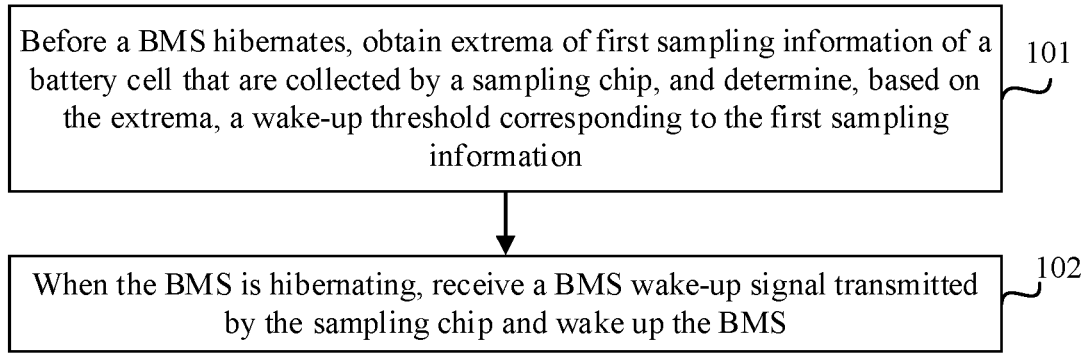
FIG. 1 is a schematic flowchart of a BMS wake-up method according to an embodiment of this application.

To make the objectives, technical solutions, and advantages of the embodiments of this application clearer, the following clearly and completely describes the technical solutions in the embodiments of this application with reference to the accompanying drawings in the embodiments of this application. Apparently, the described embodiments are some but not all of the embodiments of this application. All other embodiments obtained by a person of ordinary skill in the art based on the embodiments of this application without creative efforts shall fall within the protection scope of this application.

Unless otherwise defined, all technical and scientific terms used herein shall have the same meanings as commonly understood by those skilled in the art to which this application belongs. The terms used in the specification of this application are merely intended to describe the specific embodiments but not intended to constitute any limitation on this application.

The term "embodiment" described herein means that specific features, structures or characteristics in combination with descriptions of the embodiments may be incorporated in at least one embodiment of this application. The word "embodiment" in various positions in the specification does not necessarily refer to a same embodiment, or an independent or alternative embodiment that is exclusive of other embodiments. A person skilled in the art explicitly or implicitly understands that the embodiments described herein may be combined with other embodiments.

In terms of categories, a battery in an embodiment of this application may be a lithium-ion battery, a lithium metal battery, a lead-acid battery, a nickel-cadmium battery, a nickel-metal hydride battery, a lithium-sulfur battery, a lithium-air battery, a sodium-ion battery, or the like. This is not specifically limited in the embodiments of this application. In addition, a vehicle in an embodiment of this application includes a battery. The battery includes a battery management system (BMS). Generally, after the vehicle is started, the BMS is woken up to enter a normal working state. When the BMS is normally working, a sampling chip collects information such as a voltage and a temperature of a battery cell, to monitor safety of the battery. However, when the vehicle is parked and hibernating, the BMS is in a standing state and cannot monitor an abnormal voltage and an abnormal temperature of the battery cell, that is, cannot monitor safety of the battery in a timely manner.

On this basis, this application provides a BMS wake-up method. Before a BMS hibernates, the BMS self-learns a wake-up threshold in real time. Before power-off, the BMS transmits the wake-up threshold to a sampling chip, so that when the BMS is hibernating, the sampling chip collects a sampling value of sampling information of a battery cell in real time. When it is determined that the sampling value of the sampling information collected when the BMS is hibernating reaches the wake-up threshold, the sampling chip wakes up the BMS, to make the BMS enter a working state again to monitor safety of a battery. Therefore, safety of the battery can be monitored in a timely manner.

The following describes a BMS wake-up method according to an embodiment of this application with reference to FIG. 1. Specifically, the method may be applied to a BMS. Certainly, the BMS in this embodiment of this application may alternatively be an independent apparatus or device. The BMS can be woken up by using the BMS wake-up method according to this embodiment of this application. As shown in FIG. 1, the method includes the following steps.

Step 101: Before the BMS hibernates, obtain an extremum of first sampling information of a battery cell that is collected by a sampling chip, and determine, based on the extremum, a wake-up threshold corresponding to the first sampling information.

The wake-up threshold is used for the sampling chip to wake up the BMS that is hibernating.

Step 102: When the BMS is hibernating, receive a BMS wake-up signal transmitted by the sampling chip and wake up the BMS.

The BMS wake-up signal is transmitted by the sampling chip when it is determined that a sampling value of second sampling information of the battery cell reaches the wake-up threshold, and the second sampling information of the battery cell is collected by the sampling chip when the BMS is hibernating.

The sampling chip is provided in a battery pack. Before hibernating, the BMS is working normally. The BMS that is working normally may collect the first sampling information such as a first voltage or a first temperature of the battery cell in the battery pack through the sampling chip, and then determine, based on the extremum of the first sampling information of the battery cell that is collected by the sampling chip, the wake-up threshold corresponding to the first sampling information. When the BMS is hibernating, the sampling chip collects the second sampling information of the battery cell, generates the BMS wake-up signal when it is determined that the sampling value of the second sampling information of the battery cell reaches the wake-up threshold, and transmits the BMS wake-up signal to the BMS. Accordingly, the BMS receives the wake-up signal and is woken up based on the wake-up signal. The BMS that is woken up can enter a working state again to monitor safety of a battery.

It should be noted that a battery pack may have one or more sampling chips. In an embodiment of this application, before a BMS hibernates, each sampling chip may collect first sampling information of a battery cell, and one or more wake-up thresholds corresponding to the first sampling information collected by each sampling chip are determined based on an extremum of the first sampling information that is collected by each sampling chip. After the BMS hibernates, each sampling chip may transmit a BMS wake-up signal to the BMS and wake up the BMS when it is determined that a sampling value of second sampling information collected by the sampling chip reaches its wake-up threshold corresponding to the first sampling information collected by the sampling chip. That is, any sampling chip can wake up the BMS when the sampling value of the collected sampling information reaches the wake-up threshold. In this way, the BMS can be woken up in a timely manner by the wake-up signal, and therefore the BMS can find battery safety problems in a timely manner.

Figure 2:
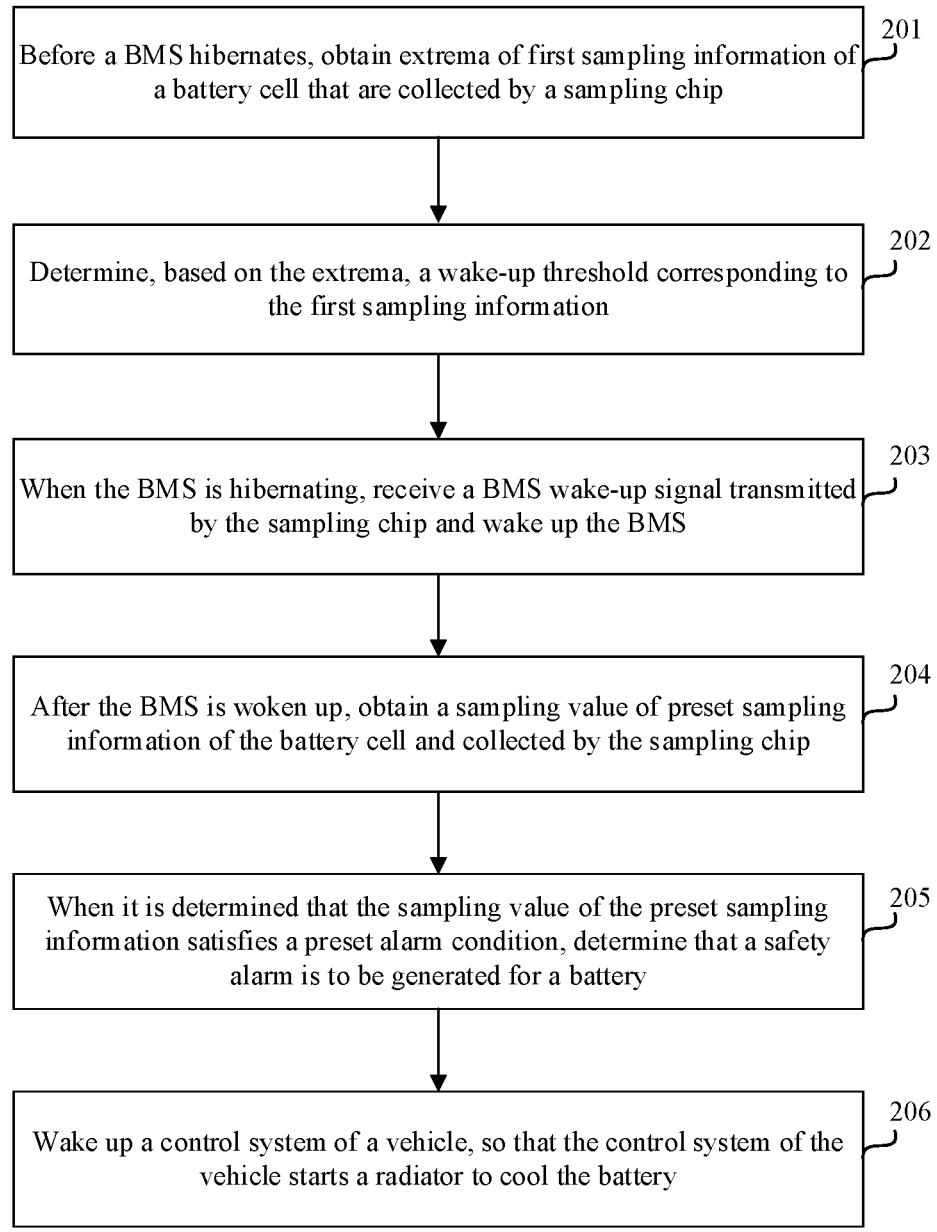
FIG. 2 is a schematic flowchart of another BMS wake-up method according to an embodiment of this application.

FIG. 2 is a schematic flowchart of another BMS wake-up method according to an embodiment of this application. As shown in FIG. 2, the method includes the following steps.

Step 201: Before a BMS hibernates, obtain an extremum of first sampling information of a battery cell that is collected by a sampling chip.

It should be noted that the first sampling information may be a first sampling voltage, a first sampling temperature, or the like. Any sampling chip may monitor one or more battery cells. In each sampling time, each sampling chip may collect multiple pieces of first sampling information. Therefore, an extremum of the first sampling information of the battery cell that is collected by the sampling chip may be determined based on the multiple pieces of first sampling information collected by the sampling chip.

In an example of any sampling chip, when the BMS is normally working, the sampling chip may collect multiple sampling values of the first sampling information of the battery cell in real time, and transmit the multiple sampling values to the BMS in real time, and the BMS determines a maximum and/or a minimum of the multiple sampling values. Alternatively, after collecting the multiple sampling values of the first sampling information of the battery cell, the sampling chip may determine a maximum and/or a minimum based on the multiple sampling values, and transmit the determined maximum and/or the determined minimum to the BMS. How the BMS obtains the extremum of the first sampling information of the battery cell that is collected by the sampling chip is not limited in this embodiment of this application.

Step 202: Determine, based on the extremum, a wake-up threshold corresponding to the first sampling information.

The wake-up threshold is used for the sampling chip to wake up the BMS that is hibernating.

It should be noted that in this application, each time before hibernating, the BMS obtains, in real time, an extremum of the first sampling information of the battery cell that is collected by the sampling chip, and determines, based on the extremum and in real time, the wake-up threshold corresponding to the first sampling information. Therefore, the wake-up threshold is automatically regulated based on the extremum of the first sampling information of the battery cell that is collected by the sampling chip, rather than fixed, and is high in accuracy. This can improve timeliness and accuracy of the time to wake up the BMS.

In some embodiments, the first sampling information includes a first sampling voltage, the second sampling information includes a second sampling voltage, the wake-up threshold includes a first abnormal voltage threshold, and a process for implementing step 202 may be: determining a minimum of the first sampling voltage as a first target voltage value; and determining, based on the first target voltage value and a first voltage threshold, the first abnormal voltage threshold.

For example, the first voltage threshold includes a voltage down-regulation threshold, and when the first abnormal voltage threshold is determined based on the first target voltage value and the first voltage threshold, a difference between the first target voltage value and the voltage down-regulation threshold may be determined as the first abnormal voltage threshold.

It should be noted that when the BMS is hibernating, the battery cell is in a standing state. In this case, depolarization occurs. In the depolarization process, a voltage of the battery cell may drop slightly. In this application, a voltage down-regulation threshold may be set based on a case that a voltage of the battery cell drops in the battery cell depolarization process. In a possible scenario, the voltage down-regulation threshold may be a fixed value, for example, 300 mV (millivolts). In another possible scenario, considering that obvious depolarization occurs on the battery cell at the beginning of a standing state, a voltage of the battery cell drops much, and a larger voltage down-regulation threshold may be set. Thereafter, the voltage of the battery cell slightly drops, and therefore a smaller voltage down-regulation threshold may be set. That is, the voltage down-regulation threshold may alternatively be an unfixed value that changes with hibernation duration of the BMS. For example, one hour before the BMS hibernates, the voltage down-regulation threshold may be set to 300 mV, and one hour after the BMS hibernates, the voltage down-regulation threshold may be set to 100 mV, 50 mV, or the like.

Further, considering that under normal circumstances, no matter how low a voltage of a battery cell in a battery pack is, no battery cell undervoltage class 2 occurs, the first voltage threshold may further include a battery cell undervoltage class 2 threshold. In this case, when the first abnormal voltage threshold is determined based on the first target voltage value and the first voltage threshold, the difference between the first target voltage value and the voltage down-regulation threshold may be first determined, and then a larger one of the difference and the battery cell undervoltage class 2 threshold is determined as the first abnormal voltage threshold. Each battery pack has a different battery cell undervoltage class 2 threshold.

It should be noted that in this embodiment of this application, one wake-up threshold (that is, the first abnormal voltage threshold) corresponding to the first sampling voltage is determined based on the minimum (that is, the first target voltage value) of the first sampling voltage and the first voltage threshold. The first voltage threshold is set based on a case that a voltage drops in a battery cell depolarization process, and/or a case that no battery cell undervoltage class 2 occurs in a battery cell depolarization process, and therefore is high in accuracy. In this way, accuracy of the first abnormal voltage threshold determined based on the first target voltage value and the first voltage threshold is also improved.

In some other embodiments, the first sampling information includes a first sampling voltage, the second sampling information includes a second sampling voltage, the wake-up threshold includes a second abnormal voltage threshold, and a process for implementing step 202 may be: determining a maximum of the first sampling voltage as a second target voltage value; and determining, based on the second target voltage value and a second voltage threshold, the second abnormal voltage threshold.

For example, the second voltage threshold includes a first voltage up-regulation threshold, and when the second abnormal voltage threshold is determined based on the second target voltage value and the second voltage threshold, a sum of the second target voltage value and the first voltage up-regulation threshold may be determined as the second abnormal voltage threshold.

It should be noted that in a battery cell depolarization process, a voltage of the battery cell may drop and may also rise back. In this application, the first voltage up-regulation threshold may further be set based on a case that a voltage of the battery cell rises back in the battery cell depolarization process. The first voltage up-regulation threshold may be a fixed value, for example, 300 mV, or may be an unfixed value that changes with hibernation duration of the BMS. For example, one hour before the BMS hibernates, the first voltage up-regulation threshold may be set to 300 mV, and one hour after the BMS hibernates, the first voltage up-regulation threshold may be set to 100 mV, 50 mV, or the like. For a setting basis of the first voltage up-regulation threshold, reference may be made to a setting basis of the voltage down-regulation threshold. Details are not described herein again.

Further, considering that under normal circumstances, no matter how high a voltage of a battery cell is, the voltage does not exceed a full charge voltage plus a second voltage up-regulation threshold, the second voltage threshold may further include the battery cell full charge voltage and the second voltage up-regulation threshold. In this case, when the first abnormal voltage threshold is determined based on the first target voltage value and the first voltage threshold, a sum of the second target voltage value and the first voltage up-regulation threshold may be first determined as a first value, a sum of the battery cell full charge voltage and the second voltage up-regulation threshold is determined as a second value, and then a smaller one of the first value and the second value is determined as the second abnormal voltage threshold. The second voltage up-regulation threshold may be set based on experience, and may be set to a relatively small value, for example, 100 mV.

It should be noted that in this embodiment of this application, another wake-up threshold (that is, the second abnormal voltage threshold) corresponding to the first sampling voltage is determined based on the maximum (that is, the second target voltage value) of the first sampling voltage and the second voltage threshold. The second voltage threshold is set based on a case that a voltage rises back in a battery cell depolarization process, and/or a case that a voltage of a battery cell normally does not exceed the full charge voltage plus the second voltage up-regulation threshold, and therefore is high in accuracy. Therefore, accuracy of the second abnormal voltage threshold determined based on the second target voltage value and the second voltage threshold is also improved.

In still some other embodiments, the first sampling information includes a first sampling temperature, the second sampling information includes a second sampling temperature, the wake-up threshold includes a first abnormal temperature threshold, and a process for implementing step 202 may be: determining a maximum of the first sampling temperature as a first target temperature value; and determining a sum of the first target temperature value and a temperature up-regulation threshold as the first abnormal temperature threshold.

It should be noted that after the BMS hibernates, a battery pack is in a standing state, and a temperature may rise back but does not reach a quite high value. In this application, the maximum of the first sampling temperature is up-regulated by adding the temperature up-regulation threshold, to obtain the first abnormal temperature threshold. This is high in accuracy. The temperature up-regulation threshold may be set based on experience, for example, may be 2° C. (degrees Celsius).

With reference to description in step 201, it can be learned that the extremum of the first sampling information of the battery cell that is collected by each sampling chip may be determined based on the multiple pieces of first sampling information collected by the sampling chip, and step 202 actually is determining, based on the extremum of the first sampling information of the battery cell that is collected by each sampling chip, a wake-up threshold corresponding to the first sampling information collected by the sampling chip. After step 202 of determining the wake-up threshold corresponding to the first sampling information collected by each sampling chip, before hibernating, the BMS may transmit, to the corresponding sampling chip, the wake-up threshold corresponding to the sampling chip. Accordingly, each sampling chip may receive and store the wake-up threshold that is transmitted by the BMS and that corresponds to the first sampling information collected by the sampling chip. For example, if a wake-up threshold determined based on an extremum of multiple first sampling voltages that are collected by the first sampling chip is 4.1 V (volts), and a wake-up threshold determined based on an extremum of multiple first sampling voltages that are collected by the second sampling chip is 4.2 V, before hibernating, the BMS transmits the wake-up threshold 4.1 V to the first sampling chip, and transmits the wake-up threshold 4.2 V to the second sampling chip.

After the BMS hibernates, the sampling chip collects a sampling value of second sampling information of the battery cell in real time under low power consumption. When it is determined that the sampling value of the second sampling information collected by the sampling chip reaches the wake-up threshold corresponding to the collected first sampling information, the sampling chip generates the BMS wake-up signal, and transmits the BMS wake-up signal to the BMS by using a pre-designed hardware circuit (or a wake-up circuit).

It should be noted that the second sampling information may be a second sampling voltage, a second sampling temperature, or the like. The BMS wake-up signal of this application may be transmitted by the sampling chip when it is determined that the sampling value of the second sampling voltage reaches the first abnormal voltage threshold, or when it is determined that the sampling value of the second sampling chip reaches the second abnormal voltage threshold, or when the sampling value of the second sampling temperature reaches the first abnormal temperature threshold. Specifically, the BMS wake-up signal may be transmitted when it is determined that the sampling value of the second sampling voltage is less than or equal to the first abnormal voltage threshold, or when it is determined that the sampling value of the second sampling chip is greater than or equal to the second abnormal voltage threshold, or when it is determined that the sampling value of the second sampling temperature is greater than or equal to the first abnormal temperature threshold. This is not limited in the embodiments of this application.

For example, in a first sampling time after the BMS hibernates, a sampling chip collects multiple sampling values of second sampling voltage and multiple sampling values of second sampling temperature. If any one of the sampling values of the second sampling voltage is less than or equal to the first abnormal voltage threshold, or any one of sampling values of the second sampling voltage is greater than or equal to the second abnormal voltage threshold, or any one of the sampling values of the second sampling temperature is greater than or equal to the first abnormal temperature threshold, the sampling chip may transmit a wake-up signal to the BMS in the first sampling time, to wake up the BMS that is hibernating.

Further, to reduce a misjudgment rate, the BMS wake-up signal of this application may further be transmitted by the sampling chip when it is determined that at least two conditions of a first condition, a second condition and a third conduction are satisfied simultaneously. The first condition means that the sampling value of the second sampling voltage reaches the first abnormal voltage threshold, the second condition means that the sampling value of the second sampling chip reaches the second abnormal voltage threshold, and the third condition means that the sampling value of the second sampling temperature reaches the first abnormal temperature threshold. This is not limited in the embodiments of this application.

Step 203: When the BMS is hibernating, receive the BMS wake-up signal transmitted by the sampling chip and wake up the BMS.

The BMS wake-up signal is transmitted by the sampling chip when it is determined that a sampling value of second sampling information of the battery cell reaches the wake-up threshold, and the second sampling information of the battery cell is collected by the sampling chip when the BMS is hibernating.

After the BMS is woken up, whether to generate a safety alarm for a battery may be monitored through step 204 and step 205 as follows, to automatically recognize a possible anomaly and monitor safety of a battery in a timely manner.

Step 204: After the BMS is woken up, obtain a sampling value of preset sampling information of the battery cell collected by the sampling chip.

It should be noted that the preset sampling information may be a third sampling voltage, a third sampling temperature, or the like. After the BMS is woken up, the sampling chip may collect multiple sampling values of the third sampling voltage and multiple sampling values of the third sampling temperature of the battery cell in real time, and transmit, to the BMS, the multiple collected sampling values of the third sampling voltage and the multiple collected sampling values of the third sampling temperature. Accordingly, the BMS may receive the multiple sampling values of the third sampling voltage that are collected by the sampling chip and the multiple sampling values of the third sampling temperature that are collected by the sampling chip.

Step 205: When it is determined that the sampling value of the preset sampling information satisfies a preset alarm condition, determine that a safety alarm is to be generated for a battery.

In some embodiments, after the BMS is woken up, whether thermal runaway has occurred on a battery pack may be checked. When it is determined that thermal runaway has occurred, it is considered that a safety alarm is to be generated for the battery. The alarm condition may include a thermal runaway voltage threshold and a thermal runaway temperature threshold. When the sampling value of the third sampling voltage is less than or equal to the thermal runaway voltage threshold and the sampling value of the third sampling temperature is greater than or equal to the thermal runaway temperature threshold, it may be determined that the sampling value of the preset sampling information satisfies the preset alarm condition. The thermal runaway voltage threshold and the thermal runaway temperature threshold may be set based on experience. The thermal runaway voltage threshold may be less than the first abnormal voltage threshold and the second abnormal voltage threshold. The thermal runaway temperature threshold may be less than the first abnormal temperature threshold.

In some other embodiments, if no thermal runaway is detected on the battery pack after the BMS is woken up, but if it is detected that the sampling value of the third sampling temperature is abnormal, for example, the sampling value of the third sampling temperature is too high, or the sampling value of the third sampling temperature exhibits a temperature rise, it may also be considered that a safety alarm is to be generated for the battery. The alarm condition may include the second abnormal temperature threshold.

When the sampling value of the third sampling temperature is greater than or equal to the second abnormal temperature threshold, it may be determined that the sampling value of the third sampling temperature is too high, and therefore it may be determined that the sampling value of the preset sampling information satisfies the preset alarm condition. The second abnormal temperature threshold may be set based on experience. Generally, the second abnormal temperature threshold is an unreachable high temperature, and may be greater than the first abnormal temperature threshold. Therefore, the second abnormal temperature threshold may be set to a relatively large value, for example, may be 70° C.

When a sampling value of the third sampling temperature of a sampling point collected by the sampling chip in a later time is greater than a sampling value of the third sampling temperature of the sampling point collected in a current time, it may be determined that the sampling value of the third sampling temperature exhibits a temperature rise, and therefore it may be determined that the sampling value of the preset sampling information satisfies the preset alarm condition.

Step 206: Wake up a control system of a vehicle, so that the control system of the vehicle starts a radiator to cool the battery.

It should be noted that the vehicle includes the battery. In this application, after it is determined that a safety alarm is to be generated for the battery, the BMS that is woken up may further wake up the control system of the vehicle in a CAN communication manner or other wake-up manners. After the control system of the vehicle is woken up, the control system may take measures to cool the battery, so as to avoid safety accidents. For example, the control system may control a system to start the radiator to cool the battery. The radiator may be a water pump, other thermal management components, or the like.

Further, the BMS that is woken up continuously performs step 204 and step 205 for a period of time. If it is determined that the no safety alarm is to be generated for the battery in this period of time, the BMS hibernates again. Then, the steps of the BMS wake-up method according to the embodiments of this application may be performed again. Generally, the BMS that is woken up may continuously perform step 204 and step 205 for 10 minutes.

In an embodiment of this application, before the BMS hibernates, the wake-up threshold corresponding to first sampling information is determined based on the obtained extremum of the first sampling information of the battery cell. After the BMS hibernates, the sampling chip collects the second sampling information of the battery cell when the BMS is hibernating, and transmits the wake-up signal to the BMS when it is determined that the second sampling information of the battery cell reaches the wake-up threshold. In this way, the BMS can be woken up in a timely manner by the wake-up signal, and therefore the BMS can find battery safety problems in a timely manner.

Figure 3:
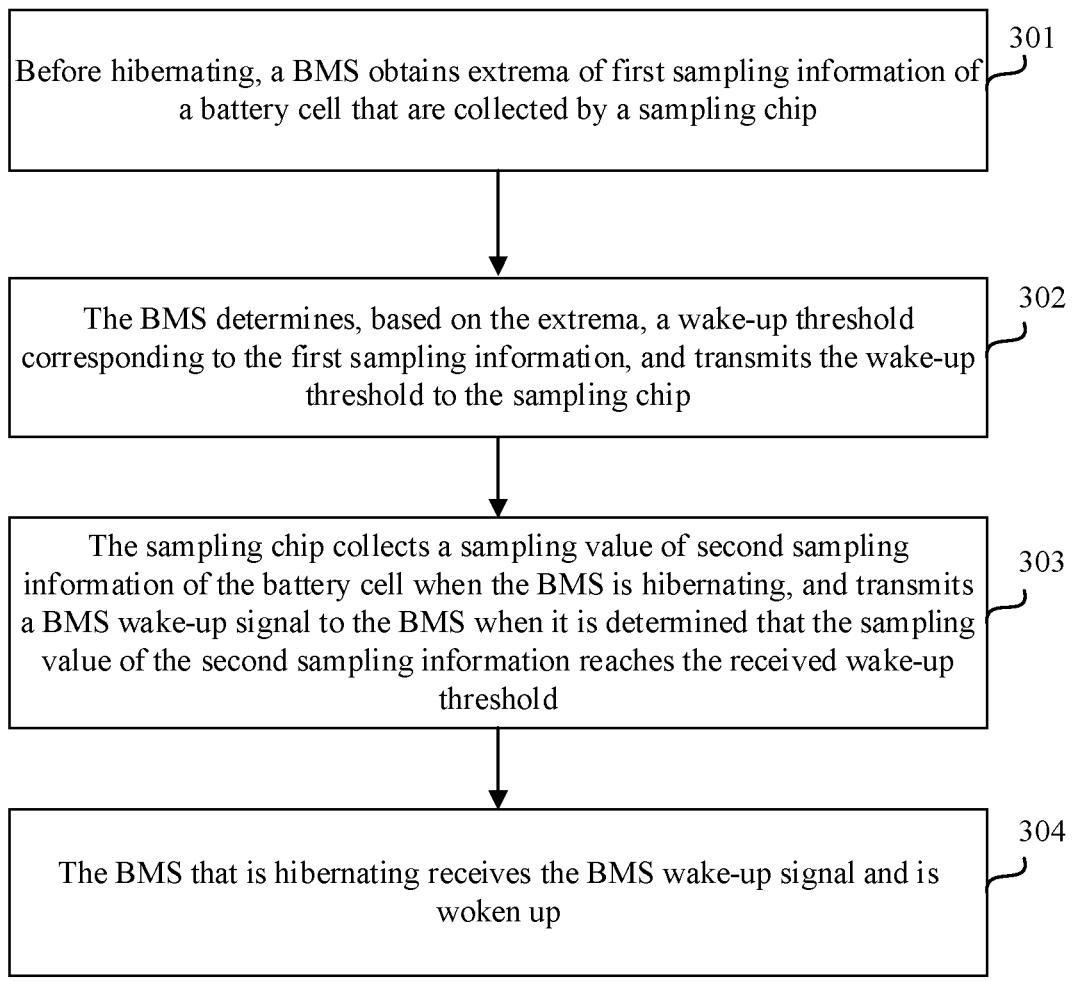
FIG. 3 is a schematic flowchart of still another BMS wake-up method according to an embodiment of this application.

FIG. 3 is a schematic flowchart of still another BMS wake-up method according to an embodiment of this application. Interaction bodies of the method include a BMS and a sampling chip. As shown in FIG. 3, the method includes the following steps.

Step 301: Before hibernating, the BMS obtains an extremum of first sampling information of a battery cell that is collected by the sampling chip.

Step 302: The BMS determines, based on the extremum, a wake-up threshold corresponding to the first sampling information, and transmits the wake-up threshold to the sampling chip.

Step 303: The sampling chip collects a sampling value of second sampling information of the battery cell when the BMS is hibernating, and transmits a BMS wake-up signal to the BMS when it is determined that the sampling value of the second sampling information reaches the received wake-up threshold.

Step 304: The BMS that is hibernating receives the BMS wake-up signal and is woken up.

For interpretation of step 301 to step 304, reference is made to related descriptions of step 201 to step 203. After the BMS is woken up, safety of the battery can be monitored. For interpretation about the BMS monitoring safety of the battery, reference is made to related descriptions of step 204 to step 206. Details are not described herein.

In this embodiment of this application, before the BMS hibernates, the wake-up threshold corresponding to the first sampling information is determined based on the obtained extremum of the first sampling information of the battery cell. After the BMS hibernates, the sampling chip collects the second sampling information of the battery cell when the BMS is hibernating, and transmits the wake-up signal to the BMS when it is determined that the second sampling information of the battery cell reaches the wake-up threshold. In this way, the BMS can be woken up in a timely manner by the wake-up signal, and therefore the BMS can find battery safety problems in a timely manner.

Figure 4:
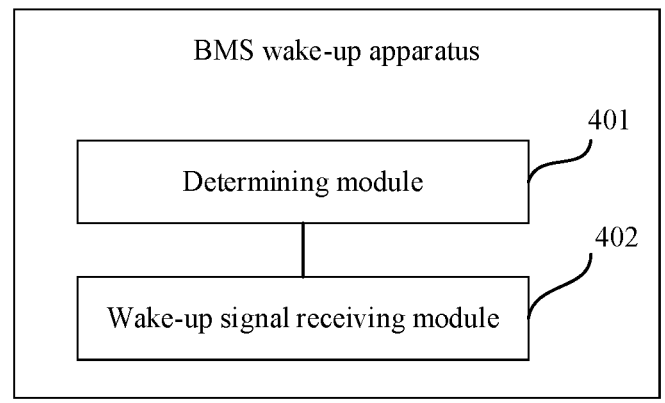
FIG. 4 is a schematic structural diagram of a BMS wake-up apparatus according to an embodiment of this application.

FIG. 4 is a schematic structural diagram of a BMS wake-up apparatus according to an embodiment of this application. As shown in FIG. 4, the apparatus includes a determining module 401 and a wake-up signal receiving module 402.

The determining module 401 is configured to obtain, before a BMS hibernates, an extremum of first sampling information of a battery cell that is collected by a sampling chip, and determine, based on the extremum, a wake-up threshold corresponding to the first sampling information, where the wake-up threshold is used for the sampling chip to wake up the BMS that is hibernating.

The wake-up signal receiving module 402 is configured to receive, when the BMS is hibernating, a BMS wake-up signal transmitted by the sampling chip and wake up the BMS, where the BMS wake-up signal is transmitted by the sampling chip when it is determined that a sampling value of second sampling information of the battery cell reaches the wake-up threshold, and the second sampling information of the battery cell is collected by the sampling chip when the BMS is hibernating.

Optionally, the first sampling information includes a first sampling voltage, the second sampling information includes a second sampling voltage, the wake-up threshold includes a first abnormal voltage threshold, and the determining module 401 is configured to: determine a minimum of the first sampling voltage as a first target voltage value; and determine, based on the first target voltage value and a first voltage threshold, a first abnormal voltage threshold.

Optionally, the first voltage threshold includes a voltage down-regulation threshold, and the determining module 401 is configured to: determine a difference between the first target voltage value and the voltage down-regulation threshold as the first abnormal voltage threshold.

Optionally, the first voltage threshold includes a voltage down-regulation threshold and a battery cell undervoltage class 2 threshold, and the determining module 401 is configured to: determine a larger one of the battery cell undervoltage class 2 threshold and a difference between the first target voltage value and the voltage down-regulation threshold as the first abnormal voltage threshold.

Optionally, the first sampling information includes a first sampling voltage, the second sampling information includes a second sampling voltage, the wake-up threshold includes a second abnormal voltage threshold, and the determining module 401 is configured to: determine a maximum of the first sampling voltage as a second target voltage value; and determine, based on the second target voltage value and a second voltage threshold, a second abnormal voltage threshold.

Optionally, the second voltage threshold includes a first voltage up-regulation threshold, and the determining module 401 is configured to: determine a sum of the second target voltage value and the first voltage up-regulation threshold as the second abnormal voltage threshold.

Optionally, the second voltage threshold includes a first voltage up-regulation threshold, a battery cell full charge voltage and a second voltage up-regulation threshold, and the determining module 401 is configured to: determine a smaller one of a sum of the second target voltage value and the first voltage up-regulation threshold, and a sum of the battery cell full charge voltage and the second voltage up-regulation threshold as the second abnormal voltage threshold.

Optionally, the first sampling information includes a first sampling temperature, the second sampling information includes a second sampling temperature, the wake-up threshold includes a first abnormal temperature threshold, and the determining module 401 is configured to: determine a maximum of the first sampling temperature as a first target temperature value; and determine a sum of the first target temperature value and a temperature up-regulation threshold as the first abnormal temperature threshold.

In this embodiment of this application, before the BMS hibernates, the wake-up threshold corresponding to the first sampling information is determined based on the obtained extremum of the first sampling information of the battery cell. After the BMS hibernates, the sampling chip collects the second sampling information of the battery cell when the BMS is hibernating, and transmits the wake-up signal to the BMS when it is determined that the second sampling information of the battery cell reaches the wake-up threshold. In this way, the BMS can be woken up in a timely manner by the wake-up signal, and therefore the BMS can find battery safety problems in a timely manner.

For the apparatus in the foregoing embodiment, a specific manner in which the modules implement operations has been described in the embodiments of the method in detail. Details are not described herein.

It should be understood that division of the units in the foregoing apparatus is merely logical function division, and during actual implementation, the units may be all or partly integrated into a physical entity, or may be separated physically. In addition, the units in the apparatus may be all implemented in a form of software called by processing elements, or may be all implemented in a form of hardware, or may be implemented partly in a form of software called by processing elements and partly in a form of hardware. For example, each unit may be a separate processing element, or may be integrated into a chip of the apparatus. In addition, each unit may alternatively be stored in a memory in a form of program for calling by a given processing element of the apparatus to implement functions of the unit. In addition, these units may be all or partly integrated, or may be implemented separately. The processing elements herein may be an integrated circuit capable of signal processing. In an implementation process, all the steps of the foregoing method or all the foregoing units may be implemented through an integrated logic circuit of hardware in the processing elements, or may be implemented in a form of software called by the processing elements.

An embodiment of this application further provides a computer-readable storage medium, where the computer-readable storage medium stores a computer program or an instruction. When the computer program or the instruction is executed by a processor, the BMS wake-up methods according to the embodiments in FIG. 1 to FIG. 3 are implemented.

The computer-readable storage medium may include an electronic circuit, a semiconductor memory device, a read-only memory (ROM), a flash memory, an erasable ROM (EROM), a floppy disk, a CD-ROM, a compact disc, a hard disk, an optical carrier, a radio frequency (RF) link, and the like. This is not limited herein.

Figure 5:
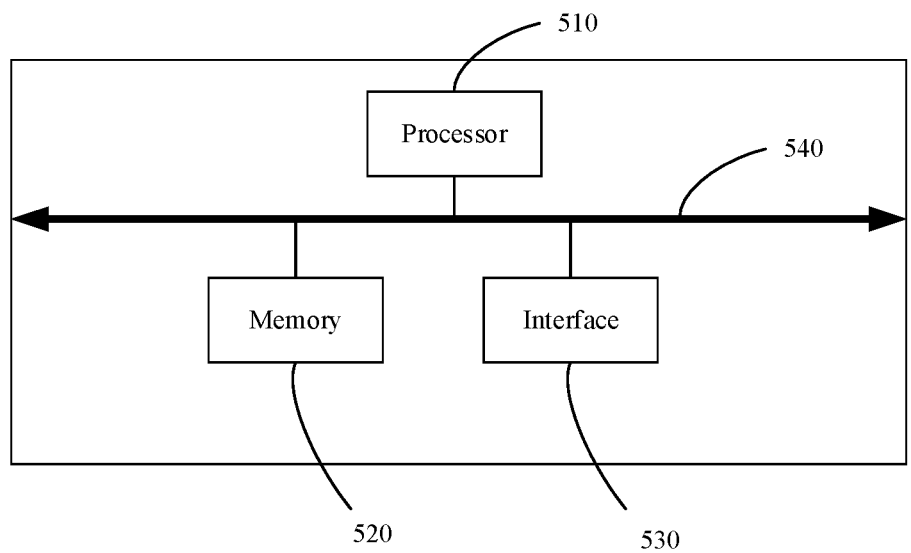
FIG. 5 is a schematic structural diagram of another BMS wake-up apparatus according to an embodiment of this application.

FIG. 5 is a schematic structural diagram of another BMS wake-up apparatus according to an embodiment of this application. Referring to FIG. 5, the BMS wake-up apparatus includes a processor 510, a memory 520, and an interface 530. The processor 510, the memory 520, and the interface 530 are connected through a bus 540. The bus may be implemented through a connecting circuit. The memory 520 is configured to store programs. When the programs are called by the processor 510, the methods executed by the BMS wake-up apparatus according to the foregoing embodiments can be implemented. The interface 530 is configured to communicate with another BMS wake-up apparatus. The interface 530 may communicate with the another BMS wake-up apparatus in a wired connection manner or a wireless connection manner.

Functions of the units of the foregoing BMS wake-up apparatus may be implemented by calling programs stored in the memory 520 by the processor 510. That is, the foregoing BMS wake-up apparatus includes the processor 510 and the memory 520. The memory 520 is configured to store programs. When the programs are called by the processor 510, the methods according to the foregoing method embodiments are implemented. The processor 510 herein may be a general-purpose processor, or may be other processors capable of calling programs. Alternatively, the processor 510 may be configured as one or more integrated circuits to implement the methods executed by the BMS wake-up apparatus according to the foregoing embodiments, for example, one or more application specific integrated circuits (ASIC), one or more digital signal processors (DSP), one or more field programmable gate arrays (FPGA), other programmable-logic devices, discrete gate or transistor logic devices, discrete hardware components, or the like. For another example, in a case that the units in the BMS wake-up apparatus may be implemented by calling programs by the processor, the processor 510 may be a general-purpose processor, for example, a central processing unit (CPU), a controller, a micro-controller, a single-chip microcomputer, or other processors capable of calling programs. For another example, these units may be integrated, to be implemented on a system on chip.

The number of memories 520 is not limited, and may be one or more.

The memory 520 includes at least one type of readable storage medium. The readable storage medium includes a non-volatile memory or a volatile memory, for example, a flash memory, a hard disk, a multimedia card, a disk memory (for example, SD or DX memory), a random access memory (RAM), a read-only memory (ROM), an erasable programmable read-only memory (EPROM), an electrically erasable programmable read-only memory (EEPROM), a programmable read-only memory (PROM), a magnetic memory, a magnetic disk, a compact disc, or the like. The RAM may include a static RAM or a dynamic RAM. In some embodiments, the memory 520 may be an internal memory of the apparatus, for example, a hard disk or a memory of the apparatus. In some other embodiments, the memory 520 may alternatively be an external storage device of the apparatus, for example, a plug-in hard disk, a smart media card (SMC), a secure digital (SD) card, a flash card, or the like that is provided on the apparatus. Certainly, the memory 520 may alternatively include both an internal memory of the apparatus and an external storage device of the apparatus. In this embodiment, the memory 520 is generally configured to store an operating system and various application software that are installed in the apparatus, for example, program code for the BMS wake-up method. In addition, the memory 520 may be further configured to temporarily store various data that has been output or that is to be output.

The bus 540 may be an industry standard architecture (ISA) bus, a peripheral component interconnect (PCI) bus, an extended industry standard architecture (EISA) bus, or the like. The bus 540 may include an address bus, a data bus, a control bus, or the like. For ease of illustration, the bus is only represented by one bold line in the figure, but this does not mean that there is only one bus or one type of bus.

Generally, the processor 510 is configured to control overall operations of the apparatus. In this embodiment, the memory 520 is configured to store program code or instructions. The program code includes computer operation instructions. The processor 510 is configured to execute the program code or instructions stored in the memory 520, or process data, for example, to run program code for the BMS wake-up method.

To sum up, in the embodiments of this application, before the BMS hibernates, the wake-up threshold corresponding to the first sampling information is determined based on the obtained extremum of the first sampling information of the battery cell. After the BMS hibernates, the sampling chip collects the second sampling information of the battery cell when the BMS is hibernating, and transmits the wake-up signal to the BMS when it is determined that the second sampling information of the battery cell reaches the wake-up threshold. In this way, the BMS can be woken up in a timely manner by the wake-up signal, and therefore the BMS can find battery safety problems in a timely manner.

A person skilled in the art can understand that although some embodiments herein include some features included in other embodiments rather than other features, combinations of features of different embodiments fall within the scope of this application and form different embodiments. For example, in the claims, any one of the claimed embodiments may be used in any combination.

In conclusion, the foregoing embodiments are merely intended for describing the technical solutions of this application, but not for limiting this application. Although this application is described in detail with reference to the foregoing embodiments, a person of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A battery management system (BMS) wake-up method, comprising:
    before a BMS hibernates, obtaining a first sampling voltage of a battery cell that is collected by a sampling chip, and determining, based on an extremum of the first sampling voltage, a wake-up threshold, wherein the wake-up threshold is used for the sampling chip to wake up the BMS when the BMS is hibernating; and
    when the BMS is hibernating, receiving a BMS wake-up signal transmitted by the sampling chip and waking up the BMS, wherein the BMS wake-up signal is transmitted by the sampling chip when it is determined that a sampling value of a second sampling voltage of the battery cell reaches the wake-up threshold, and the second sampling voltage of the battery cell is collected by the sampling chip when the BMS is hibernating;
    wherein determining, based on the extremum of the first sampling voltage, the weak-up threshold comprises:
        determining the extremum of the first sampling voltage as a target voltage; and
        determining, based on the target voltage and a voltage threshold, the wake-up threshold.

2. The method according to claim 1, wherein the wake-up threshold is a first abnormal voltage threshold, and determining, based on the extremum of the first sampling voltage, the wake-up threshold comprises:
    determining a minimum of the first sampling voltage as a first target voltage; and
    determining, based on the first target voltage and a first voltage threshold, the first abnormal voltage threshold.

3. The method according to claim 2, wherein the first voltage threshold comprises a voltage down-regulation threshold, and determining, based on the first target voltage and the first voltage threshold, the first abnormal voltage threshold comprises:
    determining a difference between the first target voltage and the voltage down-regulation threshold as the first abnormal voltage threshold.

4. The method according to claim 2, wherein the first voltage threshold comprises a voltage down-regulation threshold and a battery cell undervoltage class 2 threshold, and determining, based on the first target voltage and the first voltage threshold, the first abnormal voltage threshold comprises:
    determining a larger one of the battery cell undervoltage class 2 threshold and a difference between the first target voltage value and the voltage down-regulation threshold as the first abnormal voltage threshold.

5. The method according to claim 1, wherein the wake-up threshold is a second abnormal voltage threshold, and determining, based on the extremum of the first sampling voltage, the wake-up threshold comprises:
    determining a maximum of the first sampling voltage as a second target voltage; and
    determining, based on the second target voltage and a second voltage threshold, the second abnormal voltage threshold.

6. The method according to claim 5, wherein the second voltage threshold comprises a voltage up-regulation threshold, and determining, based on the second target voltage and the second voltage threshold, the second abnormal voltage threshold comprises:
    determining a sum of the second target voltage and the voltage up-regulation threshold as the second abnormal voltage threshold.

7. The method according to claim 5, wherein the second voltage threshold comprises a first voltage up-regulation threshold, a battery cell full charge voltage and a second voltage up-regulation threshold, and determining, based on the second target voltage and the second voltage threshold, the second abnormal voltage threshold comprises:
    determining a smaller one of a sum of the second target voltage and the first voltage up-regulation threshold, and a sum of the battery cell full charge voltage and the second voltage up-regulation threshold as the second abnormal voltage threshold.

8. A battery management system (BMS) wake-up apparatus, comprising:
    a determining module, configured to obtain, before a BMS hibernates, a first sampling voltage of a battery cell that is collected by a sampling chip, and determine, based on an extremum of the first sampling voltage, a wake-up threshold, wherein the wake-up threshold is used for the sampling chip to wake up the BMS when the BMS is hibernating; and
    a wake-up signal receiving module, configured to receive, when the BMS is hibernating, a BMS wake-up signal transmitted by the sampling chip and wake up the BMS, wherein the BMS wake-up signal is transmitted by the sampling chip when it is determined that a sampling value of a second sampling voltage of the battery cell reaches the wake-up threshold, and the second sampling voltage of the battery cell is collected by the sampling chip when the BMS is hibernating;
    wherein in determining, based on the extremum of the first sampling voltage, the weak-up threshold, the determining module is configured to:
        determine the extremum of the first sampling voltage as a target voltage; and
        determine, based on the target voltage and a voltage threshold, the wake-up threshold.

9. The apparatus according to claim 8, wherein the wake-up threshold is a first abnormal voltage threshold, and in determining, based on the extremum of the first sampling voltage, the wake-up threshold, the determining module is configured to:
    determine a minimum of the first sampling voltage as a first target voltage; and
    determine, based on the first target voltage and a first voltage threshold, the first abnormal voltage threshold.

10. The apparatus according to claim 9, wherein the first voltage threshold comprises a voltage down-regulation threshold, and in determining, based on the first target voltage and the first voltage threshold, the first abnormal voltage threshold, the determining module is configured to:
  determine a difference between the first target voltage and the voltage down-regulation threshold as the first abnormal voltage threshold.

11. The apparatus according to claim 9, wherein the first voltage threshold comprises a voltage down-regulation threshold and a battery cell undervoltage class 2 threshold, and in determining, based on the first target voltage and the first voltage threshold, the first abnormal voltage threshold, the determining module is configured to:
  determine a larger one of the battery cell undervoltage class 2 threshold and a difference between the first target voltage value and the voltage down-regulation threshold as the first abnormal voltage threshold.

12. The apparatus according to claim 8, wherein the wake-up threshold is a second abnormal voltage threshold, and in determining, based on the extremum of the first sampling voltage, the wake-up threshold, the determining module is configured to:
  determine a maximum of the first sampling voltage as a second target voltage; and
  determine, based on the second target voltage value and a second voltage threshold, the second abnormal voltage threshold.

13. The apparatus according to claim 12, wherein the second voltage threshold comprises a voltage up-regulation threshold, and in determining, based on the second target voltage and the second voltage threshold, the second abnormal voltage threshold, the determining module is configured to:
  determine a sum of the second target voltage and the voltage up-regulation threshold as the second abnormal voltage threshold.

14. The apparatus according to claim 12, wherein the second voltage threshold comprises a first voltage up-regulation threshold, a battery cell full charge voltage and a second voltage up-regulation threshold, and in determining, based on the second target voltage and the second voltage threshold, the second abnormal voltage threshold, the determining module is configured to:
  determine a smaller one of a sum of the second target voltage and the first voltage up-regulation threshold, and a sum of the battery cell full charge voltage and the second voltage up-regulation threshold as the second abnormal voltage threshold.

15. A non-transitory computer-readable storage medium that stores a computer program, wherein when the computer program is executed by a processor, the BMS wake-up method according to claim 1 is implemented.

16. An electronic device, comprising:
  a processor; and
  a memory, configured to store executable instructions of the processor;
  wherein the processor is configured to, by executing the executable instructions, implement a battery management system (BMS) wake-up method that comprises:
    before a BMS hibernates, obtaining a first sampling information voltage of a battery cell that is collected by a sampling chip, and determining, based on an extremum of the first sampling voltage, a wake-up threshold, wherein the wake-up threshold is used for the sampling chip to wake up the BMS when the BMS is hibernating; and
    when the BMS is hibernating, receiving a BMS wake-up signal transmitted by the sampling chip and waking up the BMS, wherein the BMS wake-up signal is transmitted by the sampling chip when it is determined that a sampling value of a second sampling voltage of the battery cell reaches the wake-up threshold, and the second sampling voltage of the battery cell is collected by the sampling chip when the BMS is hibernating;
    wherein determining, based on the extremum of the first sampling voltage, the weak-up threshold comprises:
      determining the extremum of the first sampling voltage as a target voltage; and
      determining, based on the target voltage and a voltage threshold, the wake-up threshold.

* * * * *